(12) United States Patent
Shim et al.

(10) Patent No.: US 9,000,579 B2
(45) Date of Patent: Apr. 7, 2015

(54) INTEGRATED CIRCUIT PACKAGE SYSTEM WITH BONDING IN VIA

(75) Inventors: Il Kwon Shim, Singapore (SG); Dario S. Filoteo, Jr., Singapore (SG); Emmanuel Espiritu, Singapore (SG); Rachel Layda Abinan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 305 days.

(21) Appl. No.: 11/694,912

(22) Filed: Mar. 30, 2007

(65) Prior Publication Data

US 2008/0237873 A1 Oct. 2, 2008

(51) Int. Cl.
*H01L 23/48* (2006.01)
*H01L 23/52* (2006.01)
*H01L 21/44* (2006.01)
*H01L 23/498* (2006.01)
*H01L 23/00* (2006.01)

(52) U.S. Cl.
CPC .......... *H01L 23/49827* (2013.01); *H01L 24/48* (2013.01); *H01L 24/78* (2013.01); *H01L 24/85* (2013.01); *H01L 2224/48091* (2013.01); *H01L 2224/48227* (2013.01); *H01L 2224/48228* (2013.01); *H01L 2224/48465* (2013.01); *H01L 2224/48471* (2013.01); *H01L 2224/48479* (2013.01); *H01L 2224/4848* (2013.01); *H01L 2224/49171* (2013.01); *H01L 2224/73265* (2013.01); *H01L 2224/78301* (2013.01); *H01L 2224/85186* (2013.01); *H01L 2924/01014* (2013.01); *H01L 2924/014* (2013.01); *H01L 2924/14* (2013.01); *H01L 2924/30105* (2013.01); *H01L 2924/30107* (2013.01); *H01L 24/49* (2013.01); *H01L 2924/01033* (2013.01); *H01L 2224/32225* (2013.01); *H01L 2924/10253* (2013.01)

(58) Field of Classification Search
USPC .......... 257/690, 692, 693, 728, 784, E23.024, 257/E23.068, E21.585; 438/612
See application file for complete search history.

(56) References Cited

U.S. PATENT DOCUMENTS

| | | | |
|---|---|---|---|
| 5,476,819 A | 12/1995 | Warren | |
| 5,503,285 A | 4/1996 | Warren | |
| 5,717,252 A * | 2/1998 | Nakashima et al. | 257/707 |
| 5,840,199 A | 11/1998 | Warren | |
| 5,850,042 A | 12/1998 | Warren | |
| 6,022,797 A * | 2/2000 | Ogasawara et al. | 438/622 |
| 6,297,563 B1 * | 10/2001 | Yamaha | 257/781 |
| 6,329,711 B1 * | 12/2001 | Kawahara et al. | 257/698 |
| 6,356,453 B1 * | 3/2002 | Juskey et al. | 361/760 |
| 6,365,979 B1 * | 4/2002 | Miyajima | 257/787 |
| 6,977,439 B2 * | 12/2005 | Kang et al. | 257/777 |
| 7,042,098 B2 | 5/2006 | Harun et al. | |
| 7,393,770 B2 * | 7/2008 | Wood et al. | 438/598 |
| 2003/0042586 A1 * | 3/2003 | Ano | 257/678 |
| 2003/0205827 A1 * | 11/2003 | Gleixner et al. | 257/784 |
| 2004/0262039 A1 | 12/2004 | Taggart et al. | |
| 2007/0015338 A1 * | 1/2007 | Lee et al. | 438/400 |

* cited by examiner

Primary Examiner — Robert Huber
(74) Attorney, Agent, or Firm — Ishimaru & Associates LLP (57) ABSTRACT

An integrated circuit package system includes a substrate having an opening provided therein, forming a conductor in the opening having a closed end at the bottom, attaching an integrated circuit die over the substrate, and connecting a die interconnect to the integrated circuit die and the closed end of the conductor.

18 Claims, 4 Drawing Sheets

INTEGRATED CIRCUIT PACKAGE SYSTEM WITH BONDING IN VIA

TECHNICAL FIELD

The present invention relates generally to integrated circuit package systems, and more particularly to a system for integrated circuit packages with bonding.

BACKGROUND ART

The demands for smaller, higher performance semiconductor devices, which support portable electronic devices, have motivated the development of new techniques for producing smaller and less expensive semiconductor devices. Modern consumer electronics particularly personal portable devices, such as cellular phones, digital cameras, and music players, require increasing integrated circuit die content to fit an ever-shrinking physical space as well as increasing performance. One of these technologies involves packaging the integrated circuit die in as small a form factor as possible and manufacturing the integrated circuit die as efficiently as possible.

Semiconductor packaging technology is one of the key technologies for realizing small, highly performing electronic devices. A variety of types of semiconductor packages have evolved over time in order to realize ever increasing high density packaging, such as the dual inline package (DIP), the small outline package (SOP) and the ball grid array (BGA). A key issue with implementing high density and performing electronics is that the area occupied by a semiconductor chip's package should be reduced when possible, which is often accomplished by reducing the width of the package's wires, the pitch of the package's external terminals and the size of the package's outer casing.

First-level IC packaging performs the function of electrically connecting a silicon chip to a carrier enabling it to be safely handled and assembled into an electronic system. Key objectives of IC packaging are to route the connections of the chip to a carrier substrate in a cost-effective way, to minimize the form factor of the final IC package, and to minimize degradation of electrical performance that can be caused by packaging parasitics such as inductance, resistance, and capacitance. Therefore, an electrical objective is to maintain signal integrity despite the presence of packaging parasitics. In other words, the electrical objective is to provide an electrical path in the package on which electrical data can travel without undue noise, distortion, or interference from parasitic elements along that path.

The negative effects of these parasitics can increase with operating frequency. As chip and system speeds now routinely operate at significantly higher frequencies, it is more necessary than ever to carefully select packaging technologies, which do not interfere with the proper functioning of the system. Currently, the two of the major packaging technologies used within the IC packaging industry for chip-to-carrier, or "first-level", interconnections: are Wire-based interconnection (90-95% of chips connected) and bump-based interconnection (5-10% of chips connected).

In the case of the wire-based interconnection, a wire is bonded from a bond pad on the silicon chip to a bond finger on a carrier substrate. The resulting interconnection is referred to as a wirebond and the package is referred as a wire-based IC package. Electrical parasitics from this method of interconnection arise primary from the loop inductance of wire, the self inductance of the wire, capacitive coupling. With this method, functional limitations may arise with increased frequencies. The practical limit for this method is in large part determined by the frequency.

With bump-based interconnects, solder bumps are used instead of bonding wires. These bumps are located on the chip and each bump is soldered to a corresponding pad on a carrier substrate. During package assembly, this array of bumps on the chip must be carefully aligned with an associated array of pads on the carrier substrate. The interconnection scheme from chip bump to carrier pad needs to be determined at the time that the carrier substrate is designed; it can be difficult and expensive to reassign a bump on the chip to a different pad on the carrier substrate from the one placed directly below it. High density bump-based packages typically drive a much higher chip carrier, or substrate cost to route the bumps.

In contrast, the wire-based interconnect method allows the connection scheme between the bond pads and bond fingers to be determined at the later IC packaging manufacturing phase. This allows for electrical design flexibility at a later stage of IC packaging, which is generally desirable.

Thus, a need still remains for an integrated circuit package system to improve integrated circuit packages particularly processing, handling, and transporting mold segments. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate having an opening provided therein, forming a conductor in the opening having a closed end at the bottom, attaching an integrated circuit die over the substrate, and connecting a die interconnect to the integrated circuit die and the closed end of the conductor.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 1:
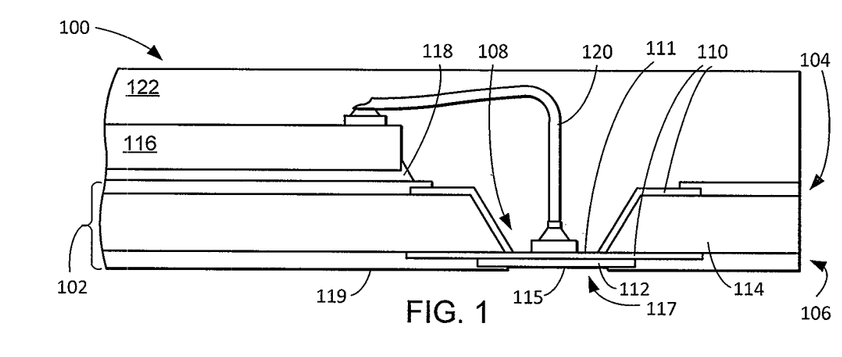
FIG. 1 is a cross-sectional view of an integrated circuit package system taken along line 1-1 of FIG. 2 in an embodiment of the present invention.
Figure 2:
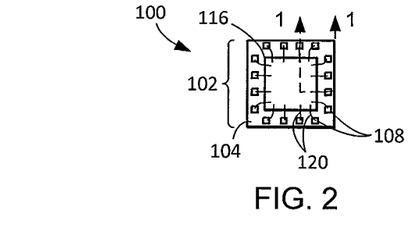
FIG. 2 is a top plan view of the integrated circuit package system.

Referring now to FIG. 1, therein is shown a cross-sectional view of an integrated circuit package system 100 taken along line 1-1 of FIG. 2 in an embodiment of the present invention. The integrated circuit package system 100 preferably includes a substrate 102 having a first substrate layer 104 and a second substrate layer 106. A substrate open connector 108, such as a plated via, can connect the first substrate layer 104 and the second substrate layer 106. The substrate open connector 108 can be formed with a conductor and substantially vertical edges. For example, forming the substrate open connector 108 with a process such as laser drilling can optionally provide an opening in the first substrate layer 104 wider than an opening near the second substrate layer 106.

The substrate open connector 108 can also include a lower closed end 111 of a conductor 110 over the opening near the second substrate layer 106 providing a bonding surface of the substrate open connector 108. The lower closed end 111 of the substrate open connector 108 can preferably be electrically connected to the second substrate layer 106 including a substrate pad 112 and a substrate insulator 114. The substrate insulator 114 can be formed with a material such as a dielectric or a solder resist. The substrate 102 can include the first substrate layer 104 on a side of the substrate insulator 114 and the second substrate layer 106 parallel to the first substrate layer 104 on an opposite side of the substrate insulator 114. The conductor 110 can be formed in the first substrate, layer 104 and in the second substrate layer 106 with the conductor 110 extended beyond the substrate open connector 108. An exposed bottom surface 115 of the substrate pad 112 of the second substrate layer 106 is exposed from the second substrate layer 106. The exposed bottom surface 115 is within a recess 117 of the second substrate layer 106 and above a substrate bottom surface 119 of the second substrate layer 106. The exposed bottom surface 115 is directly below the lower closed end 111, and is exposed from the substrate bottom surface 119 to provide electrical connectivity to a next level system such as another package or a printed circuit board.

An integrated circuit die 116 can be attached over the first substrate layer 104 with a die attach layer 118 such as an adhesive. A die interconnect 120 such as a wire bond can electrically connect the integrated circuit die 116 and the substrate open connector 108. The die interconnect 120 can be formed by a process such as wire bonding. An encapsulant 122 can optionally be applied over the die interconnect 120, the integrated circuit die 116, the substrate open connector 108, and part of the substrate 102. The encapsulant 122 can provide protection and structural integrity to the integrated circuit package system 100.

For illustrative purposes, the die interconnect 120 is shown having a direct wire bonding on the lower closed end of the conductor 110 and a ball bump on the integrated circuit die 116 for reversed-stand-off-stitch bonding (RSSB), although it is understood that any connection may be used. The die interconnect 120 has a characteristic of reversed-stand-off-stitch bonding with the die interconnect 120 bonded to the closed end and a ball bump over the integrated circuit die 116.

It has been discovered that the integrated circuit package system 100 with bonding in via significantly improves electrical performance due in part to a shorter interconnection path and eliminates the need to cover or plug the substrate interconnect with a material such as a metal cap, a solder mask resist, or any kind of epoxy plugging material.

Referring now to FIG. 2 therein is shown a top plan view of the integrated circuit package system 100. The integrated circuit package system 100 preferably includes the substrate 102 including the substrate open connector 108. The integrated circuit die 116 can preferably be mounted over the first substrate layer 104 of the substrate 102 and electrically connected to the substrate open connector 108 with the die interconnect 120. The integrated circuit package system 100 provides electrical connection from the integrated circuit die 116 to the substrate 102 with the die interconnect 120 formed directly in the substrate open connector 108 of the substrate 102.

Figure 3:
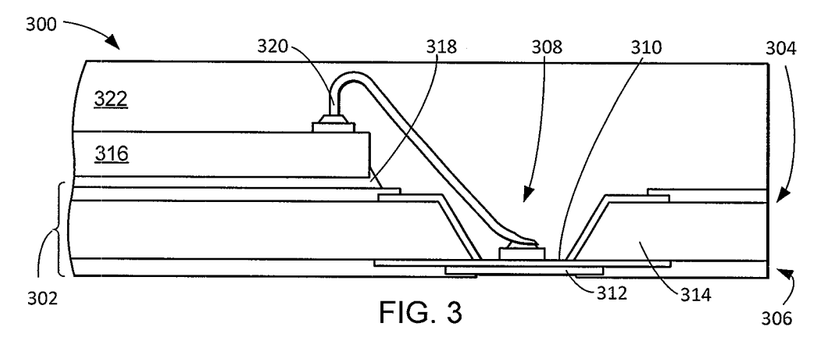
FIG. 3 is a cross-sectional view of an integrated circuit package system taken along line 3-3 of FIG. 4 in an alternative embodiment of the present invention.
Figure 4:
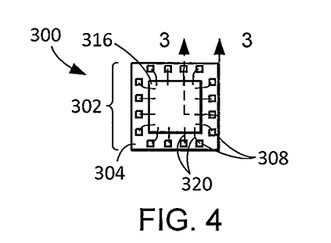
FIG. 4 is a top plan view of the integrated circuit package system.

Referring now to FIG. 3, therein is shown a cross-sectional view of an integrated circuit package system 300 taken along line 3-3 of FIG. 4 in an alternative embodiment of the present invention. Similar to the integrated circuit package system 100, the integrated circuit package system 300 preferably includes a substrate 302 having a first substrate layer 304 and a second substrate layer 306. A substrate open connector 308, such as a plated via, can connect the first substrate layer 304 and the second substrate layer 306. The substrate open connector 308 can be formed with a conductor 310 and substantially vertical edges. For example, forming the substrate open connector 308 with a process such as laser drilling can optionally provide an opening in the first substrate layer 304 wider than an opening near the second substrate layer 306.

The substrate open connector 308 can also include a lower closed end of the conductor 310 over the opening near the second substrate layer 306 providing a bonding surface of the substrate open connector 308. The lower closed end of the substrate open connector 308 can preferably be electrically connected to the second substrate layer 306 including a substrate pad 312 and a substrate insulator 314. The substrate insulator 314 can be formed with a material such as a dielectric or a solder resist. The substrate pad 312 of the second substrate layer 306 can provide electrical connectivity to a next level system such as another package or a printed circuit board.

An integrated circuit die 316 can be attached over the first substrate layer 304 with a die attach layer 318 such as an adhesive. A die interconnect 320, such as a wire bond, can electrically connect the integrated circuit die 316 and the substrate open connector 308. The die interconnect 320 can be formed by a process such as wire bonding. An encapsulant 322 can optionally be applied over the die interconnect 320, the integrated circuit die 316, the substrate open connector 308, and part of the substrate 302. The encapsulant 322 can provide protection and structural integrity to the integrated circuit package system 300.

For illustrative purposes, the die interconnect 320 is shown having a direct wire bonding over the integrated circuit die 316 and a ball bump on the lower closed end of the conductor 310 for stitch-off-bonding (SSB), although it is understood that any connection may be used. The die interconnect 320 has a characteristic of stitch-off-bonding with the die interconnect 320 bonded to the integrated circuit die 316 and a ball bump on the closed end.

Referring now to FIG. 4, therein is shown a top plan view of the integrated circuit package system 300. The integrated circuit package system 300 preferably includes the substrate 302 including the substrate open connector 308. The integrated circuit die 316 can preferably be mounted over the first substrate layer 304 of the substrate 302 and electrically connected to the substrate open connector 308 with the die interconnect 320. The integrated circuit package system 300 provides electrical connection from the integrated circuit die 316 to the substrate 302 with the die interconnect 320 formed directly in the substrate open connector 108 of the substrate 302.

Figure 5:
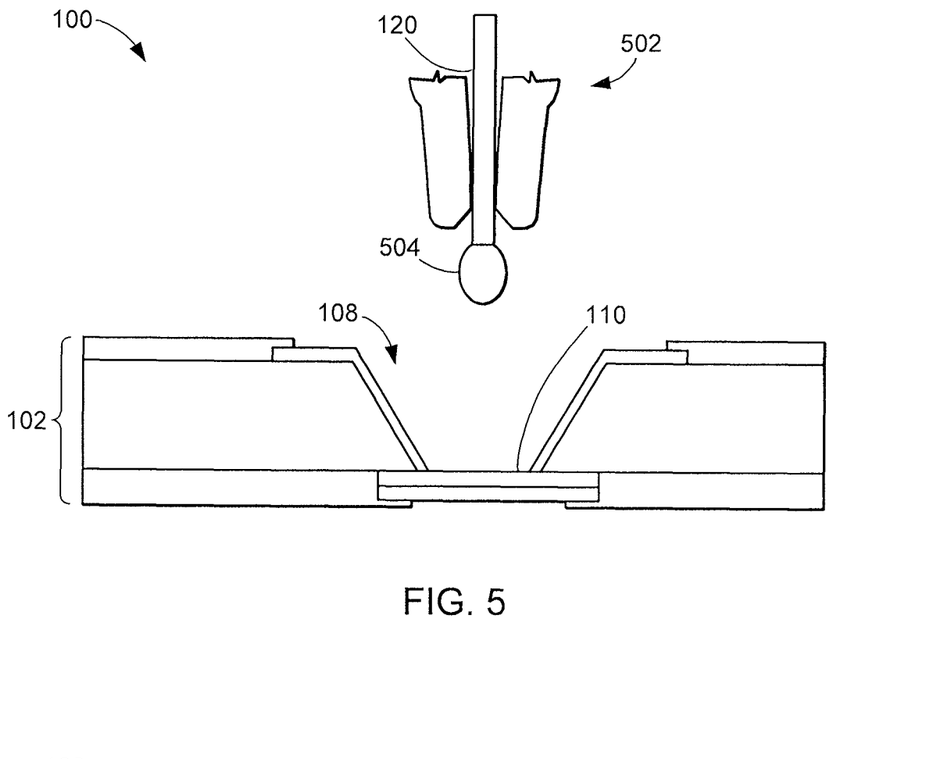
FIG. 5 is a cross-sectional view of the integrated circuit package system in a bond preparation phase.

Referring now to FIG. 5, therein is shown a cross-sectional view of the integrated circuit package system 100 in a bond preparation phase. The integrated circuit package system 100 includes the substrate 102 including the substrate open connector 108. An interconnect forming device 502 such as a wire bond capillary can provide the die interconnect 120 having a connectivity end 504 such as a ball. The connectivity end 504 of the die interconnect 120 can be formed by the interconnect forming device 502 preparing for attaching the die interconnect 120 to the lower closed end of the conductor 110 of the substrate open connector 108.

Figure 6:
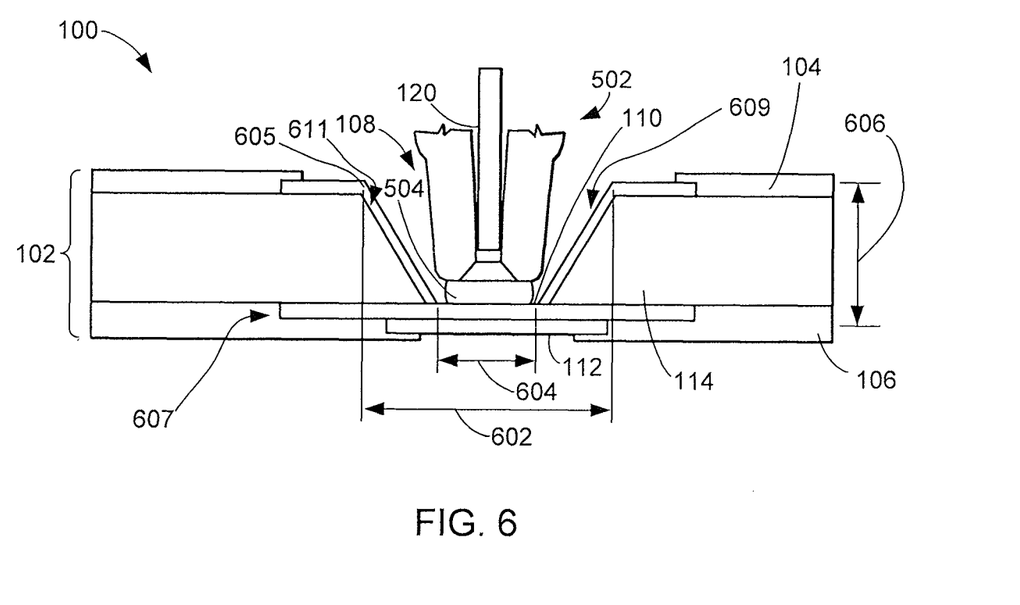
FIG. 6 is the structure of FIG. 5 in a bond attachment phase.

Referring now to FIG. 6, therein is shown the structure of FIG. 5 in a bond attachment phase. The integrated circuit package system 100 includes the connectivity end 504 of the die interconnect 120 on the lower closed end of the conductor 110 of the substrate open connector 108. The connectivity end 504 can preferably be reshaped by processes such as pressure or heat to form electrical connectivity to the substrate open connector 108 and thereby the substrate pad 112 of the second substrate layer 106.

The substrate open connector 108 can be formed having an open connector first width 602 in the first substrate layer 104 of approximately one hundred microns and an open connector second width 604 near the second substrate layer 106 of approximately seventy-five microns. The open connector first width 602 is depicted as the distance extending between bends 605 of the conductor 110 below a top surface of the first substrate layer 104 and at a top of the substrate insulator 114. A substrate thickness 606 of the substrate between the first substrate layer 104 and the second substrate layer 106 can be approximately sixty microns. The conductor 110 is depicted having a conductor base portion 607 between the second substrate layer 106 and the substrate insulator 114 and also planar portions 609 in an opening 611 in the substrate insulator 114. The planar portions 609 of the conductor 110 is depicted in direct contact with the conductor base portion 607, between the substrate insulator 114 and the first substrate layer 104, and extending from a top of the substrate insulator 114 and the conductor base portion 607. The open connector second width 604 is depicted as the distance extending at and along the conductor base portion 607 between the planar portions 609. The die interconnect 120 is attached to the conductor base portion 607 entirely within the substrate 102. The conductor base portion 607 is within the second substrate layer 106. The substrate 102 includes the conductor 110 with the conductor base portion 607 within the second substrate layer 106. The planar portions 609 are through the substrate insulator 114. The conductor base portion 607 is partially exposed from the second substrate layer 106 and below the opening 611.

Figure 7:
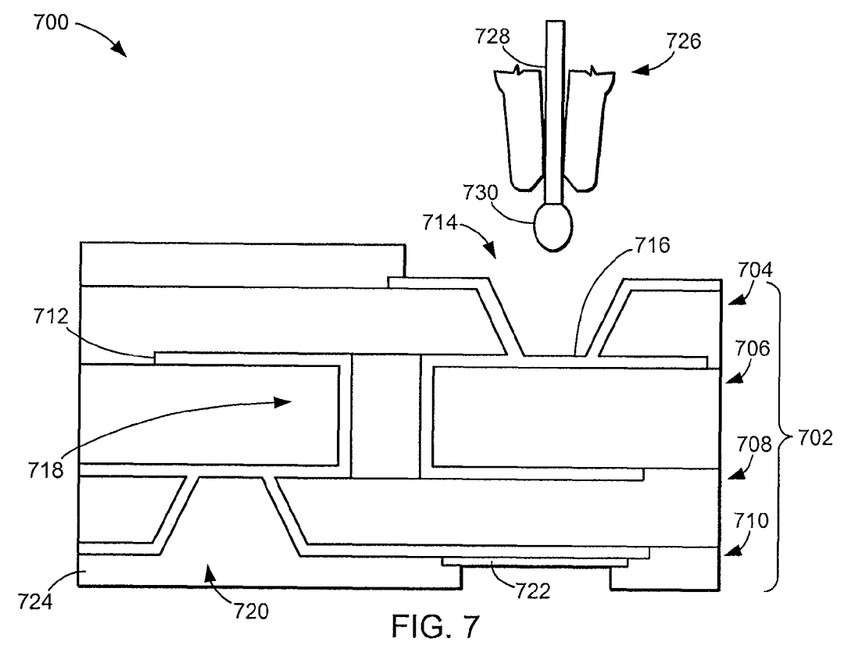
FIG. 7 is a cross-sectional view of an integrated circuit package system in a bond preparation phase in an alternative embodiment of the present invention.

Referring now to FIG. 7, therein is shown a cross-sectional view of an integrated circuit package system 700 in a bond preparation phase in an alternative embodiment of the present invention. The integrated circuit package system 700 preferably includes a substrate 702, such as a four-layer substrate, having a first substrate layer 704, a second substrate layer 706, a third substrate layer 708, and a fourth substrate layer 710.

A conductive material 712 can electrically connect the first substrate layer 704, the second substrate layer 706, the third substrate layer 708, and the fourth substrate layer 710. The substrate 702 preferably includes a substrate open connector 714 such as a plated via. The substrate open connector 714 can connect the first substrate layer 704 and the second substrate layer 706 and be formed with the conductive material 712 and substantially vertical edges.

The substrate open connector 714 can also include a lower closed end of a conductor 716 providing a bonding surface of the substrate open connector 714. The lower closed end of the substrate open connector 714 can preferably be electrically connected to the second substrate layer 706 with the conductive material 712. The second substrate layer 706 can be electrically connected to the third substrate layer 708 with a substrate connector 718 such as a blind via. The substrate connector 718 can preferably formed with the conductive material 712.

The third substrate layer 708 can be electrically connected to the fourth substrate layer 710 with a closed substrate connector 720 such as a plated via and a substrate pad 722. The closed substrate connector 720 can preferably be formed with the conductive material 712 and include a substrate insulator 724. The substrate insulator 724 can be formed from a material such as a solder resist, an epoxy plugging material or a dielectric. The substrate pad 722 of the fourth substrate layer 710 can provide electrical connectivity to a next level system such as another package or a printed circuit board.

An interconnect forming device 726 such as a wire bond capillary can provide a die interconnect 728 having a connectivity end 730 such as a ball. The connectivity end 730 of the die interconnect 728 can be formed by the interconnect forming device 726 preparing for attaching the die interconnect 728 to the lower closed end of the conductor 716.

Figure 8:
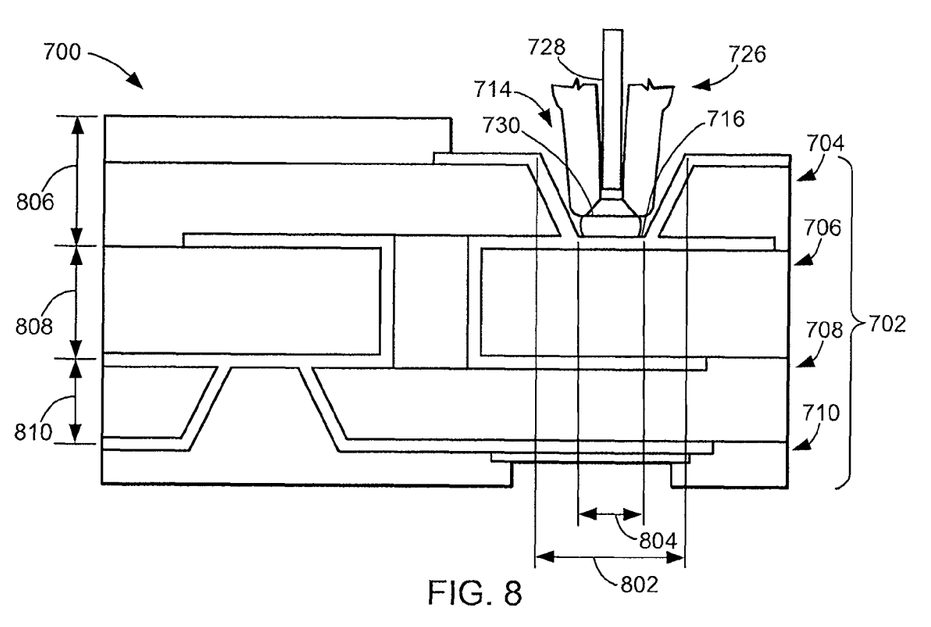
FIG. 8 is the structure of FIG. 7 in a bond attachment phase.

Referring now to FIG. 8, therein is shown the structure of FIG. 7 in a bond attachment phase. The integrated circuit package system 700 includes the connectivity end 730 of the die interconnect 728 on the lower closed end of the substrate open connector 714. The connectivity end 730 can preferably be reshaped by processes such as pressure or heat to form electrical connectivity to the substrate open connector 714 and thereby the substrate pad 722 of the fourth substrate layer 710. The substrate open connector 714 can be formed having an open connector first width 802 in the first substrate layer 704 of approximately one hundred microns and an open connector second width 804 in the second substrate layer 706 of approximately seventy-five microns.

The substrate 702 can preferably include a first substrate thickness 806 of the substrate 702 between the first substrate layer 704 and the second substrate layer 706 of approximately forty microns. Further, a second substrate thickness 808 between the second substrate layer 706 and the third substrate layer can preferably be approximately sixty microns. Similar to the thickness between the first substrate layer 704 and the second substrate layer 706, a third substrate thickness 810 between the third substrate layer and the fourth substrate layer can preferably be approximately forty microns.

Figure 9:
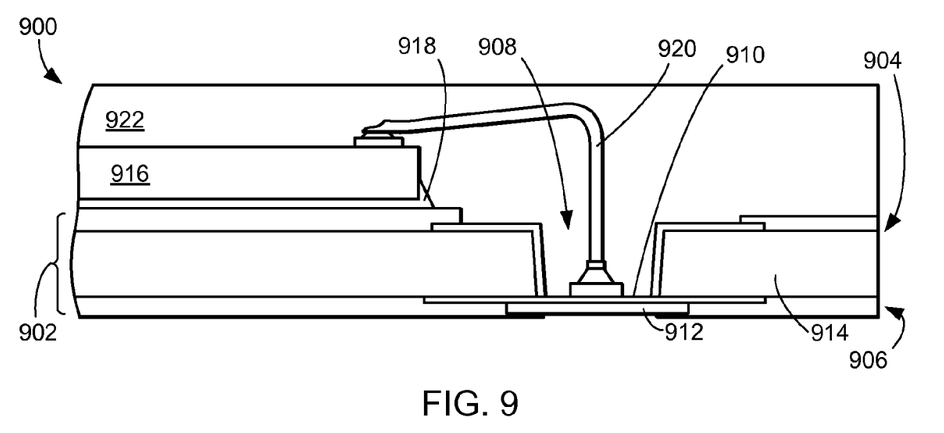
FIG. 9 is a cross-sectional view of an integrated circuit package system 900 in another alternative embodiment of the present invention.

Referring now to FIG. 9, therein is shown a cross-sectional view of an integrated circuit package system 900 in another alternative embodiment of the present invention. The integrated circuit package system 900 preferably includes a substrate 902 having a first substrate layer 904 and a second substrate layer 906. A substrate open connector 908, such as a plated via, can connect the first substrate layer 904 and the second substrate layer 906. The substrate open connector 908 can be formed with a conductive material and substantially vertical edges. For example, forming the substrate open connector 908 with a process such as mechanical drilling can optionally provide an opening in the first substrate layer 904 substantially the same width as an opening near the second substrate layer 906.

The substrate open connector 908 can also include a lower closed end of a conductor 910 over the opening near the second substrate layer 106 providing a bonding surface of the substrate open connector 908. The lower closed end of the substrate open connector 908 can preferably be electrically connected to the second substrate layer 906 including a substrate pad 912 and a substrate insulator 914. The substrate insulator 914 can be formed with a material such as a dielectric or a solder resist. The substrate pad 912 of the second substrate layer 906 can provide electrical connectivity to a next level system such as another package or a printed circuit board.

An integrated circuit die 916 can be attached over the first substrate layer 904 with a die attach layer 918 such as an adhesive. A die interconnect 920 such as a wire bond can electrically connect the integrated circuit die 916 and the substrate open connector 908. The die interconnect 920 can be formed by a process such as wire bonding. An encapsulant 922 can optionally be applied over the die interconnect 920, the integrated circuit die 916, the substrate open connector 908, and part of the substrate 902. The encapsulant 922 can provide protection and structural integrity to the integrated circuit package system 900.

For illustrative purposes, the die interconnect 920 is shown having a direct wire bonding on the lower closed end of the conductor 910 and a ball bump on the integrated circuit die 916 for reversed-stand-off-stitch bonding (RSSB), although it is understood that any connection may be used.

Figure 10:
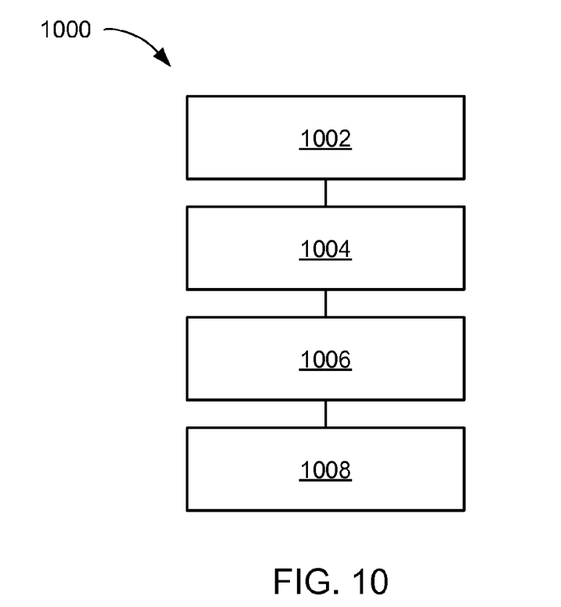
FIG. 10 is a flow chart of an integrated circuit package system for manufacturing the integrated circuit package system in an embodiment of the present invention.

Referring now to FIG. 10, therein is shown a flow chart of an integrated circuit package system 1000 for manufacturing the integrated circuit package system 100 in an embodiment of the present invention. The system 1000 includes providing a substrate having an opening provided therein in a block 1002; forming a conductor in the opening in the substrate open at the top and having a closed end at the bottom in a block 1004; attaching an integrated circuit die over the substrate in a block 1006; and connecting a die interconnect to the integrated circuit die and the conductor at to the closed end in a block 1008.

In greater detail, a system to provide the method and apparatus of the integrated circuit package system 100, in an embodiment of the present invention, is performed as follows:
 1. Forming a substrate having an opening provided therein, a first substrate layer, and a second substrate layer.
 2. Forming a conductor in the opening in the substrate open at the first substrate layer and having a closed end at the second substrate layer.
 3. Mounting an integrated circuit die over the first substrate layer adjacent the opening.
 4. Connecting a die interconnect to the integrated circuit die through the first substrate layer to the closed end near the second substrate layer.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
 forming a substrate having a conductor and a substrate insulator between a first substrate layer and a second substrate layer, wherein the conductor includes:
  a conductor base portion contacting a lower surface of the substrate insulator,
  a conductor upper portion partially covered by the first substrate layer and configured to form a perimeter,
  the conductor base portion partially covered by the second substrate layer, and
  conductor intermediate portions extending and tapering from the conductor upper portion to an upper surface of the conductor base portion forming a plurality of contacting interfaces between the conductor intermediate portions and the u per surface of the conductor base portion, wherein the contacting interfaces collectively form an exposed area on the conductor base portion, wherein the exposed area is smaller than the perimeter;

attaching an integrated circuit die over the substrate;

attaching a die interconnect from the integrated circuit die to an exposed area of the conductor base portion; and forming a substrate pad within the second substrate layer, the substrate pad below and contacting the conductor base portion opposite the exposed area thereof, an exposed bottom surface of the substrate pad is directly below the exposed area of the conductor base portion, the exposed bottom surface of the substrate pad is exposed from a substrate bottom surface providing electrical connectivity to a next level system.

2. The method as claimed in claim 1 wherein forming the substrate pad includes forming the substrate pad partially exposed from the second substrate layer.

3. The method as claimed in claim 1 wherein forming the substrate includes connecting a substrate connector to multiple layers of the substrate.

4. An integrated circuit package system comprising:
a substrate having a conductor and a substrate insulator between a first substrate layer and a second substrate layer, wherein the conductor includes:
 a conductor base portion in contact with a lower surface of the substrate insulator,
 a conductor upper portion partially covered by the first substrate layer and configured to form a perimeter,
 the conductor base portion partially covered by the second substrate layer, and
 conductor intermediate portions extending and from the conductor upper portion to an upper surface of the conductor base portion forming a plurality of contacting interfaces between the conductor intermediate portions and the upper surface of the conductor base portion, wherein the contacting interfaces collective form an exposed area on the conductor base, wherein the exposed area is smaller than the perimeter;
an integrated circuit die over the substrate;
a die interconnect attached from the integrated circuit die to an exposed area of the conductor base portion; and
a substrate pad within the second substrate layer, the substrate pad below and in contact with the conductor base portion opposite the exposed area thereof, an exposed bottom surface of the substrate pad is directly below the exposed area of the conductor base portion, the exposed bottom surface of the substrate pad is exposed from a substrate bottom surface providing electrical connectivity to a next level system.

5. The system as claimed in claim 4 wherein the substrate pad is partially exposed from the second substrate layer.

6. The system as claimed in claim 4 wherein the substrate includes a substrate connector is connected to multiple layers of the substrate.

7. The method as claimed in claim 1 wherein the conductor includes:
the conductor upper portion contacting a top surface of the substrate insulator,
the conductor base portion partially covered by the second substrate layer, and
the conductor intermediate portions contacting side surfaces of the substrate insulator connecting the conductor upper portion to the conductor base portion.

8. The method as claimed in claim 1 wherein attaching a die interconnect includes the die interconnect having stitch bonding or ball bonding entirely within the exposed area of the conductor base portion, and the die interconnect forming a connectivity end of the die interconnect entirely over and within the exposed area of the conductor base portion.

9. A method for manufacturing an integrated circuit package system comprising:
forming a substrate having a conductor and a substrate insulator between a first substrate layer and a second substrate layer, wherein the conductor includes:
 a conductor upper portion contacting a top surface of the substrate insulator,
 the conductor upper portion partially covered by the first substrate layer and configured to form a perimeter,
 a conductor base portion partially covered by the second substrate layer,
 conductor intermediate portions extending and tapering from the conductor upper portion to an upper surface of the conductor base portion forming a plurality of contacting interfaces between the conductor intermediate portions and the upper surface of the conductor base portion, wherein the contacting interfaces collectively form an exposed area on the conductor base portion, wherein the exposed area is small than the perimeter,
 the conductor base portion contacting a lower surface of the substrate insulator, and
 the conductor intermediate portions contacting side surfaces of the substrate insulator connecting the conductor upper portion to the conductor base portion;
attaching an integrated circuit die over the substrate;
attaching a die interconnect from the integrated circuit die to an exposed area of the conductor base portion; and
forming a substrate pad within the second substrate layer, the substrate pad below and contacting the conductor base portion opposite the exposed area thereof, an exposed bottom surface of the substrate pad is directly below the exposed area of the conductor base portion, the exposed bottom surface of the substrate pad is exposed from a substrate bottom surface providing electrical connectivity to a next level system.

10. The method as claimed in claim 9 wherein attaching a die interconnect includes the die interconnect having stitch bonding or ball bonding entirely within the exposed area of the conductor base portion, the die interconnect not contacting either the conductor intermediate portions or the conductor upper portion, and the die interconnect having a connectivity end of the die interconnect entirely over and within the exposed area of the conductor base portion.

11. The method as claimed in claim 9 wherein forming a substrate pad includes the substrate pad partially exposed from the second substrate layer leaving the exposed bottom surface of the substrate pad exposed from the second substrate layer, wherein the exposed bottom surface is within a recess of the second substrate layer and above a substrate bottom surface of the second substrate layer.

12. The method as claimed in claim 9 wherein forming the substrate includes connecting the conductor to a substrate connector connecting multiple layers of the substrate.

13. The system as claimed in claim 4 wherein the conductor includes:
the conductor upper portion in contact with a top surface of the substrate insulator,
the conductor base portion partially covered by the second substrate layer, and
the conductor intermediate portions in contact with side surfaces of the substrate insulator connected with the conductor upper portion and the conductor base portion.

14. The system as claimed in claim 4 wherein the die interconnect includes the die interconnect having stitch bonding or ball bonding entirely within the exposed area of the conductor base portion, and the die interconnect includes a connectivity end of the die interconnect entirely over and within the exposed area of the conductor base portion.

15. An integrated circuit package system comprising:
   a substrate having a conductor and a substrate insulator between a first substrate layer and a second substrate layer, wherein the conductor includes:
      a conductor upper portion in contact with a top surface of the substrate insulator,
      the conductor upper portion partially covered by the first substrate layer and configured to form a perimeter,
      a conductor base portion partially covered by the second substrate layer, and
      conductor intermediate portions ex from the conductor upper portion to an upper surface of the conductor base portion forming a plurality of contacting interfaces between the conductor intermediate portions and the upper surface of the conductor base portion, wherein the contacting interfaces collectively form an exposed area on the conductor base portion, wherein the exposed area is smaller than the perimeter,
      the conductor base portion in contact with a lower surface of the substrate insulator, and
      the conductor intermediate portions in contact with side surfaces of the substrate insulator connected with the conductor upper portion and the conductor base portion;
   an integrated circuit die over the substrate;
   a die interconnect attached from the integrated circuit die to an exposed area of the conductor base portion; and
   a substrate pad within the second substrate layer, the substrate pad below and in contact with the conductor base portion opposite the exposed area, an exposed bottom surface of the substrate pad is directly below the conductor base portion exposed area, the exposed bottom surface of the substrate pad is exposed from a substrate bottom surface providing electrical connectivity to a next level system.

16. The system as claimed in claim 15 wherein a die interconnect includes the die interconnect having stitch bonding or ball bonding entirely within the exposed area of the conductor base portion, the die interconnect not in contact with either the conductor intermediate portions or the conductor upper portion, and the die interconnect having a connectivity end of the die interconnect entirely over and within the exposed area of the conductor base portion.

17. The system as claimed in claim 15 wherein the substrate pad is partially exposed from the second substrate layer leaving the exposed bottom surface of the substrate pad exposed from the second substrate layer, wherein the exposed bottom surface is within a recess of the second substrate layer and above a substrate bottom surface of the second substrate layer.

18. The system as claimed in claim 15 wherein the substrate includes the conductor being connected to a substrate connector connected to the multiple layers of the substrate.

* * * * *

UNITED STATES PATENT AND TRADEMARK OFFICE
CERTIFICATE OF CORRECTION

PATENT NO. : 9,000,579 B2
APPLICATION NO. : 11/694912
DATED : April 7, 2015
INVENTOR(S) : Shim et al.

Page 1 of 1

It is certified that error appears in the above-identified patent and that said Letters Patent is hereby corrected as shown below:

In the Claims:

Column 9, line 1, Claim 1, delete "the u per" and insert therefor --the upper--

Column 9, line 33, Claim 4, delete "and from" and insert therefor --and tapering from--

Column 9, line 38, Claim 4, delete "collective" and insert therefor --collectively--

Column 9, line 39, Claim 4, delete "base, wherein" and insert therefor --base portion, wherein--

Column 10, line 23, Claim 9, delete "is small" and insert therefor --is smaller--

Column 11, line 17, Claim 15, delete "ex from" and insert therefor --extending and tapering from--

Signed and Sealed this
Fifth Day of April, 2016

Michelle K. Lee
*Director of the United States Patent and Trademark Office*